(12) United States Patent
Nakamichi

(10) Patent No.: US 11,279,544 B2
(45) Date of Patent: Mar. 22, 2022

(54) CONTAINER

(71) Applicant: SAKAI DISPLAY PRODUCTS CORPORATION, Sakai (JP)

(72) Inventor: Kazuki Nakamichi, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 236 days.

(21) Appl. No.: 16/641,122

(22) PCT Filed: Sep. 7, 2017

(86) PCT No.: PCT/JP2017/032358
§ 371 (c)(1),
(2) Date: Feb. 21, 2020

(87) PCT Pub. No.: WO2019/049287
PCT Pub. Date: Mar. 14, 2019

(65) Prior Publication Data
US 2020/0198867 A1   Jun. 25, 2020

(51) Int. Cl.
*B65D 85/30* (2006.01)
*B65D 81/05* (2006.01)

(52) U.S. Cl.
CPC .......... *B65D 81/053* (2013.01); *B65D 85/30* (2013.01)

(58) Field of Classification Search
CPC .... B65D 25/107; B65D 25/10; B65D 81/053; B65D 81/113; B65D 85/30; B65D 85/68;
(Continued)

(56) References Cited

U.S. PATENT DOCUMENTS 10,392,176 B1 * 8/2019 Hu .................... B65D 85/68
10,457,464 B2 * 10/2019 Lv .................... B65D 81/107
(Continued)

FOREIGN PATENT DOCUMENTS

CN   203581671 U   5/2014
CN   203806414 U   9/2014
(Continued)

OTHER PUBLICATIONS

International Search Report for International application No. PCT/JP2017/032357.
(Continued)

*Primary Examiner* — Steven A. Reynolds
(74) *Attorney, Agent, or Firm* — ScienBiziP, P.C.

(57) ABSTRACT

A container (100) having: a housing member (10) having a bottom surface member (12) and a side surface member (14); and a protective member (220a) having a receiving surface in contact with an item to be housed. The bottom surface member defines the xy plane and the side surface member defines the xz plane and the yz plane that are orthogonal to the xy plane. The side surface member has a cut-out section (15a) that faces a housing space. The protective member (220a) has: an inside member (122a) comprising a receiving section having first receiving surface (123) parallel to the yz plane and a second receiving surface (124) parallel to the xz plane; and an outside member (232a) arranged at least between the inside member and a side surface parallel to the yz plane of the side surface member, said outside member being fitted to the inside member (122a) so as to be slidable in a direction intersecting the floor surface. The inside member (122a) and the outside member (232a) are arranged in the cut-out section so as to each be independently attachable and detachable. A section includ-
(Continued)

ing the first receiving surface (123) is more flexible than a section including the second receiving surface (124).

18 Claims, 12 Drawing Sheets

(58) Field of Classification Search
CPC .............. B65D 85/48; B65D 2581/058; B65D 2585/6737
USPC ......................... 206/592, 594, 586, 454, 453
See application file for complete search history.

(56) References Cited

U.S. PATENT DOCUMENTS

| | | | | |
|---|---|---|---|---|
| 2008/0128310 A1* | 6/2008 | Kao | ...................... | B65D 81/107 206/521 |
| 2013/0306514 A1* | 11/2013 | Hu | ...................... | B65D 81/053 206/586 |
| 2014/0097121 A1* | 4/2014 | Chen | ...................... | B65D 85/48 206/586 |
| 2014/0202909 A1* | 7/2014 | Kuo | ...................... | B65D 11/10 206/453 |
| 2014/0262927 A1* | 9/2014 | Guo | ...................... | B65D 81/056 206/706 |
| 2014/0332422 A1* | 11/2014 | Hu | ...................... | B65D 85/48 206/320 |
| 2019/0300261 A1* | 10/2019 | Nakamichi | ............ | B65D 85/30 |
| 2020/0071052 A1* | 3/2020 | Cheng | .................. | B65D 81/054 |

FOREIGN PATENT DOCUMENTS

| | | |
|---|---|---|
| JP | S54-041862 U | 3/1979 |
| JP | S59-064770 U | 4/1984 |
| JP | S61-164188 U | 10/1986 |
| JP | S62-033147 B2 | 7/1987 |
| JP | H05-054336 U | 7/1993 |
| JP | 2013-151324 A | 8/2013 |
| JP | 2014-009020 A | 1/2014 |
| JP | 3192245 U | 8/2014 |

OTHER PUBLICATIONS

International Search Report for International application No. PCT/JP2017/018714.
Co-Pending letter regarding related co-pending U.S. Appl. No. 16/606,624, filed Oct. 18, 2019 et al.

* cited by examiner

FIG.1
(a)
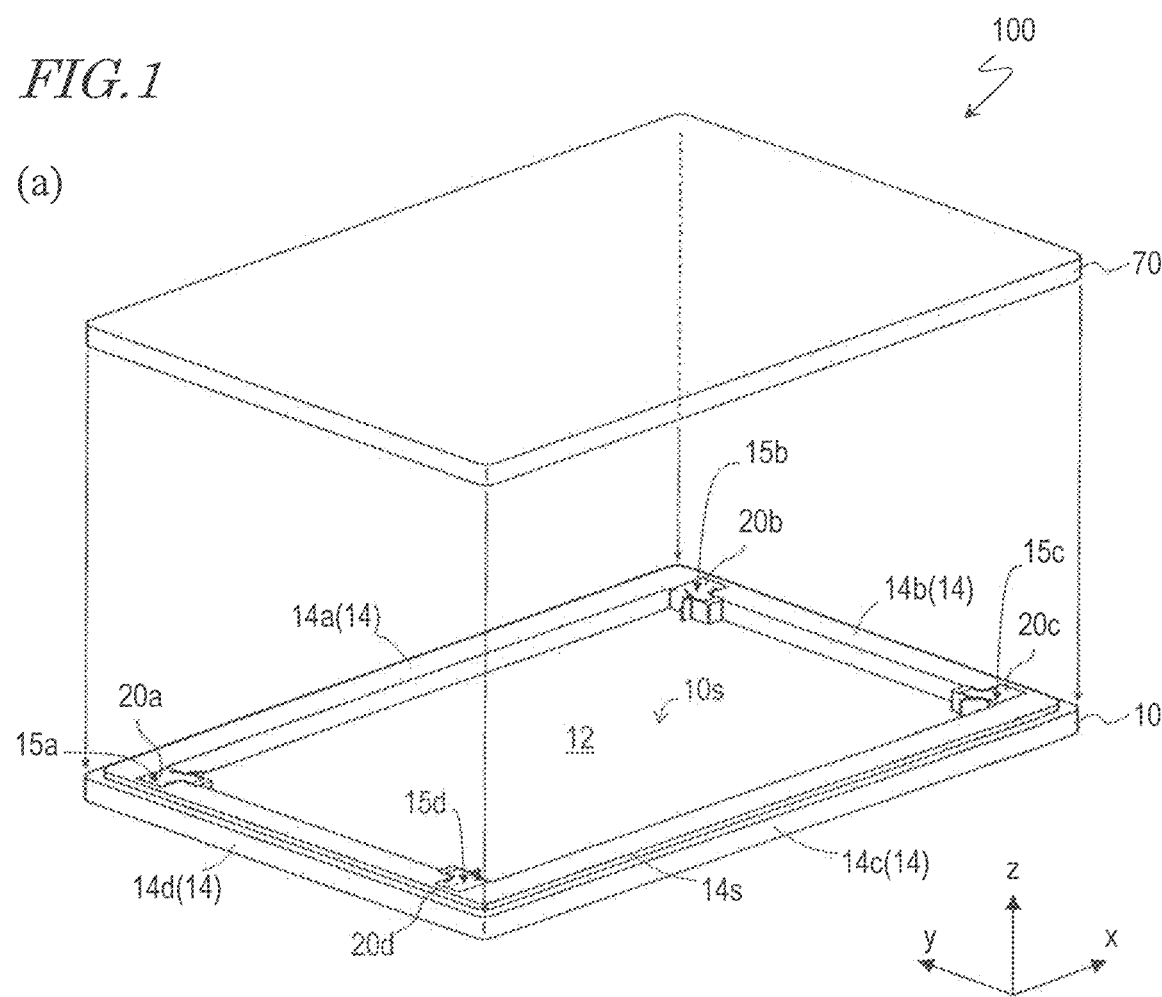
(b)
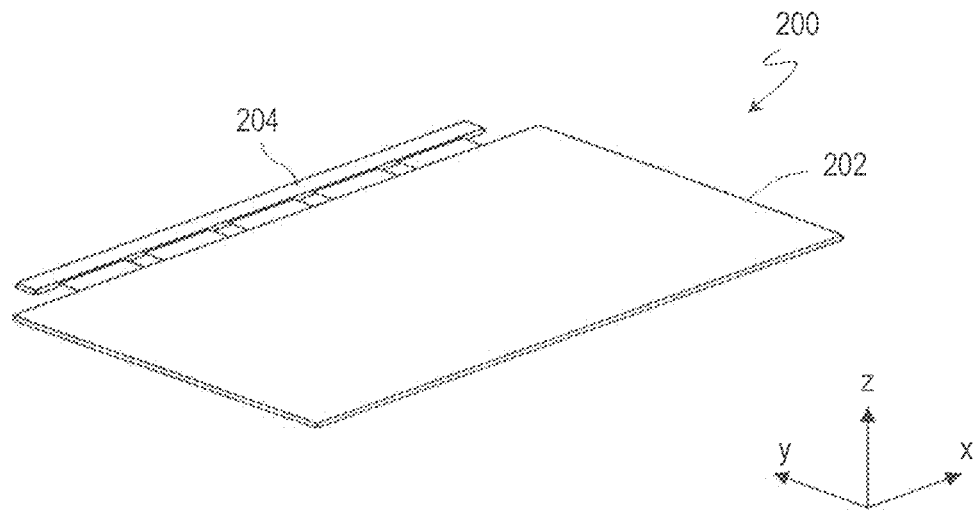

FIG.2
(a)
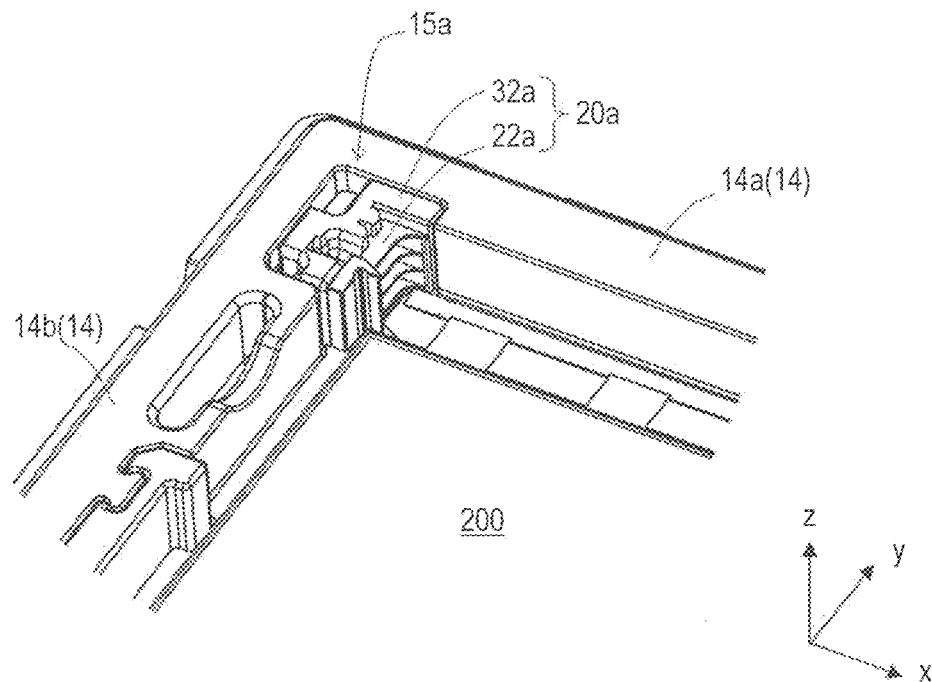
(b)
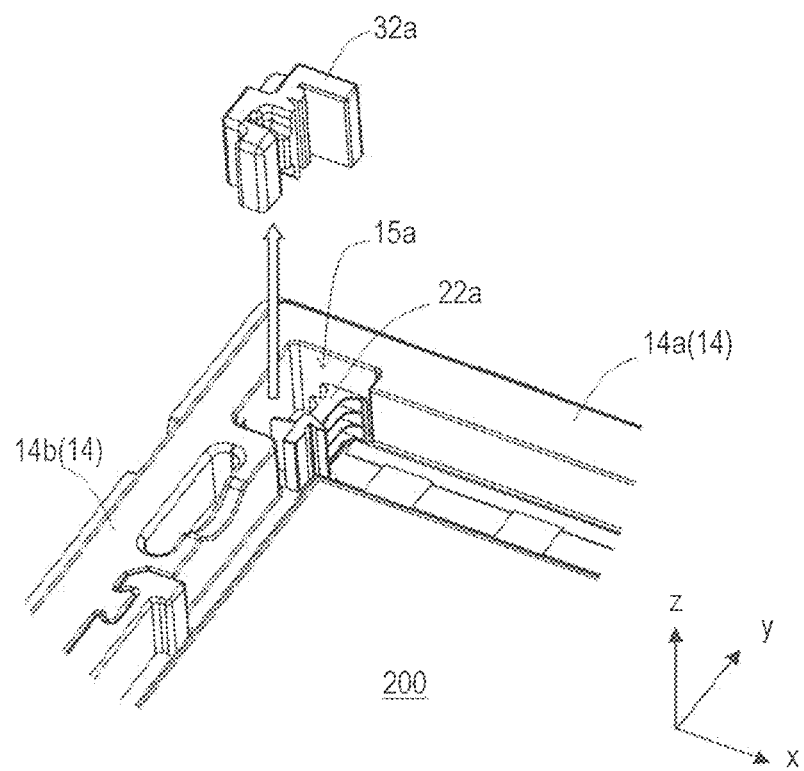

FIG.3
(a)
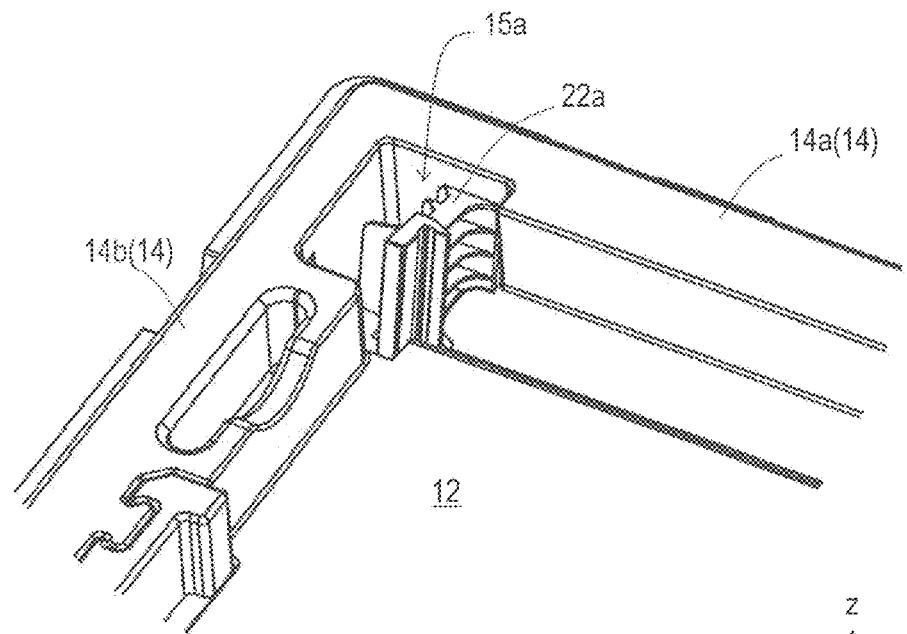
(b)
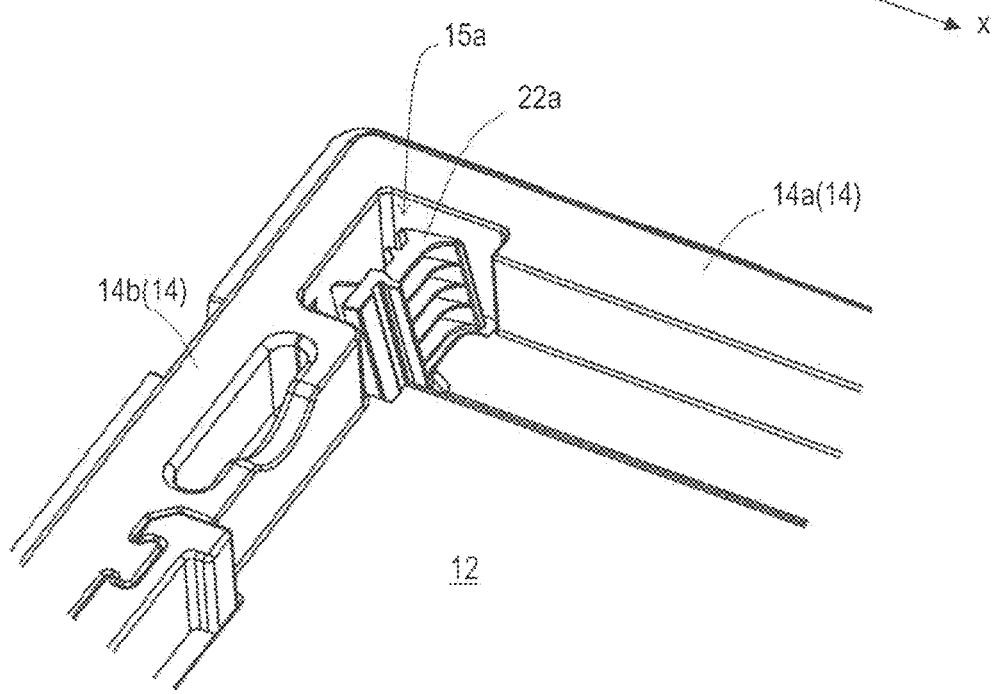

FIG.5
(a)
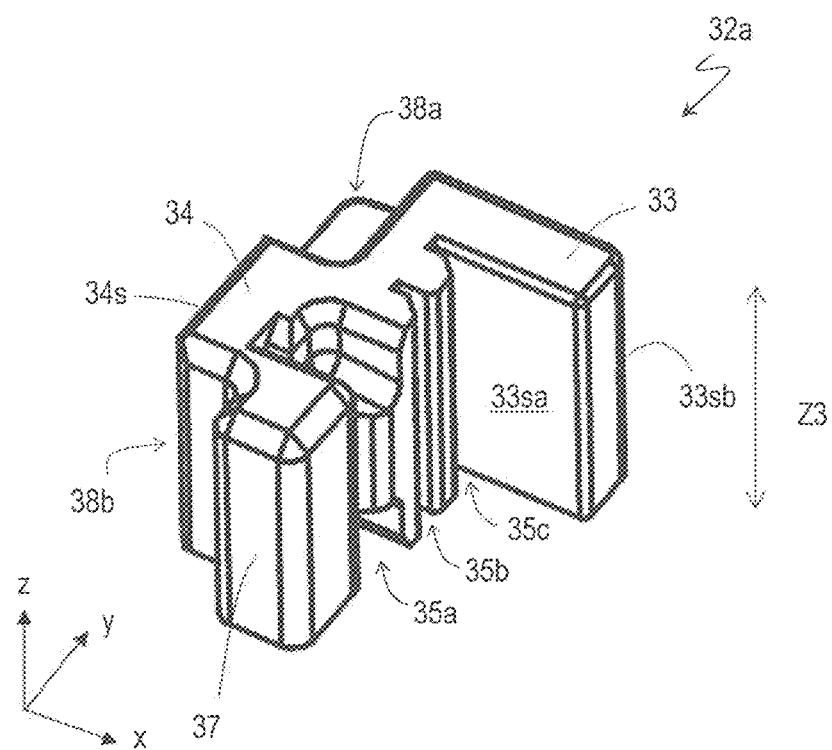
(b)
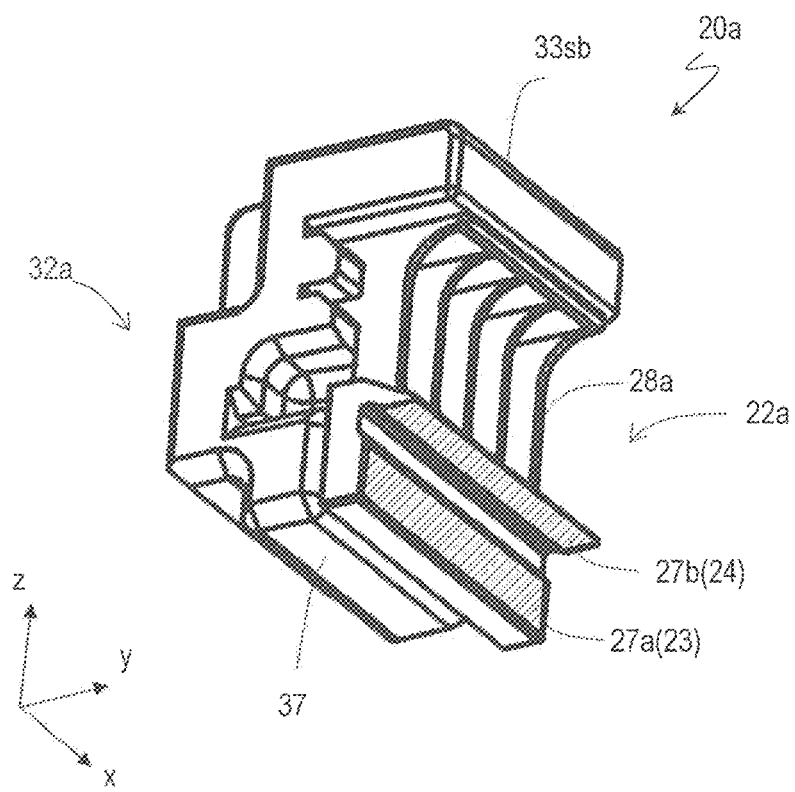

FIG. 7
(a)
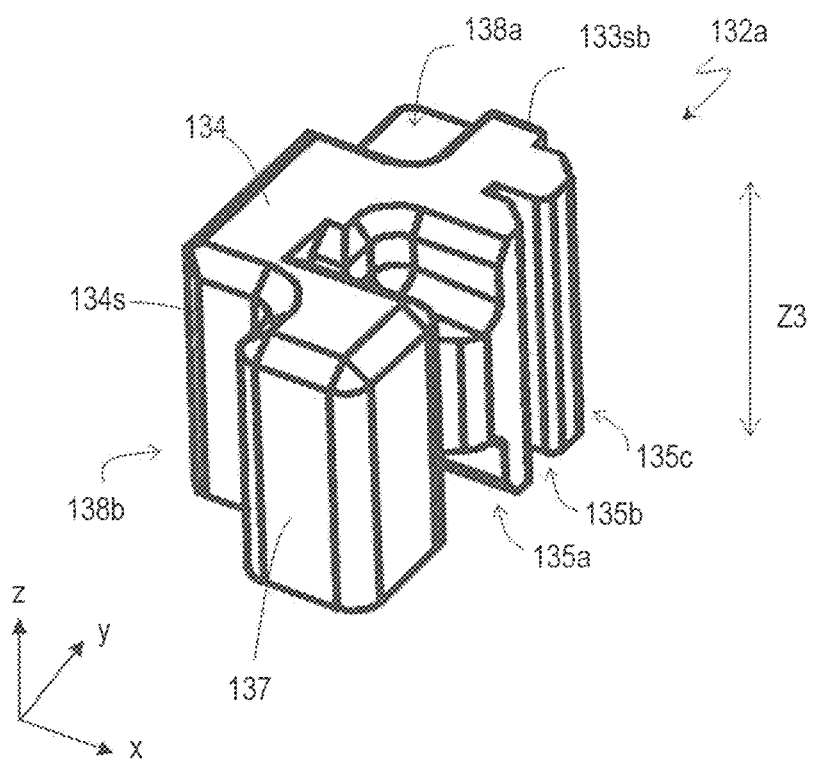
(b)
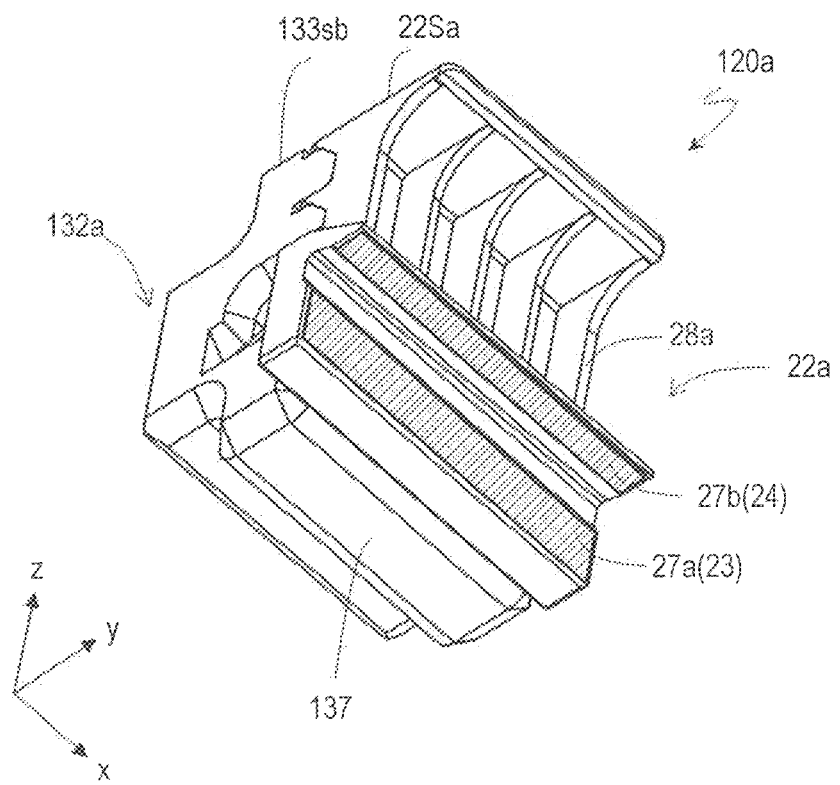

FIG.12
(a)
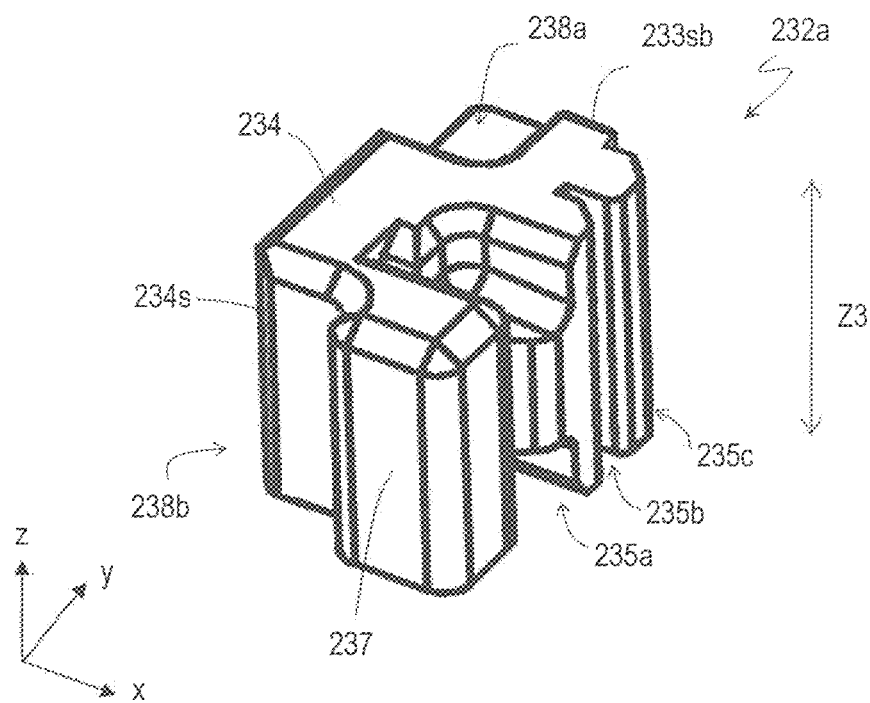
(b)
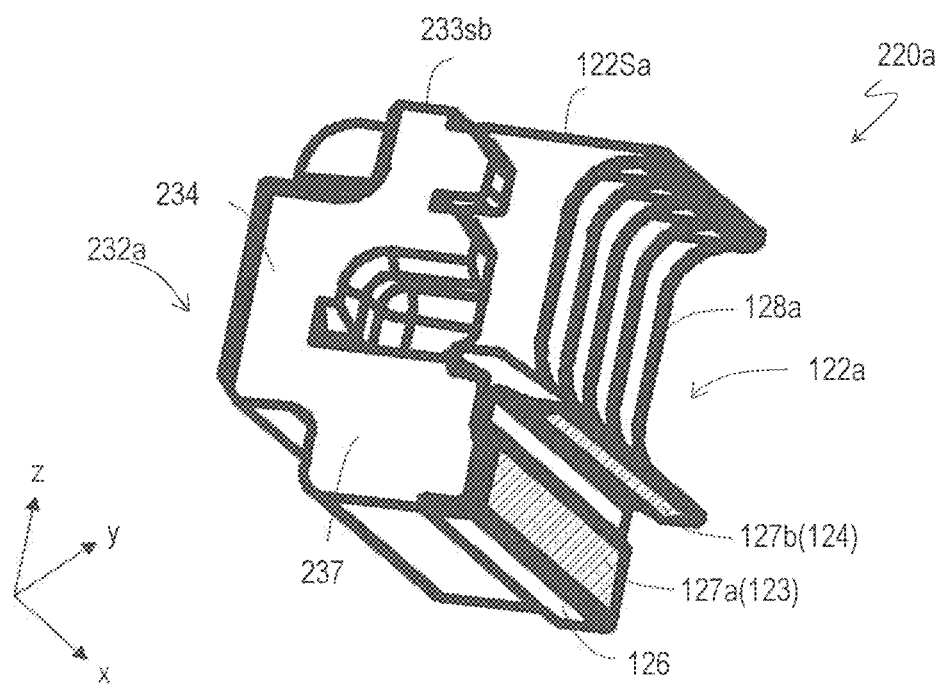

CONTAINER

TECHNICAL FIELD

The present invention relates a container, for example, a container preferably usable to transport an object accommodated therein.

BACKGROUND ART

For example, Patent Document No. 1 discloses a packaging member (i.e., container) usable to transport a display panel. The container disclosed in Patent Document No. 1 includes a corner protection member provided at a corner of a recessed portion that accommodates the display panel. The corner protection member is detachably fittable to a main body of the container and protects a corner of the display panel, which is an object to be accommodated. According to Patent Document No. 1, use of the corner protection member allows a common container main body and a common lid to be used regardless of whether a display panel having a circuit board connected therewith (hereinafter, may be referred to as a "display panel module") is to be accommodated or only a display panel is to be accommodated.

CITATION LIST

Patent Literature

Patent Document No. 1: Japanese Laid-Open Patent Publication No. 2014-9020

SUMMARY OF INVENTION

Technical Problem

However, in the case where the container described in Patent Document No. 1 is used, there are cases where during the removal of the display panel (or the display panel module) from the container, the corner of the display panel is stuck with the corner protection member, and in some cases, the display panel is broken. Or, an attempt to prevent the breakage occasionally results in a decrease in the efficiency of the work of removing the display panel. For example, there is a problem that it is difficult to automatically remove the display panel by use of a robot (this may be referred to as "problem 1").

In the case where the container described in Patent Document No. 1 is used, if, for example, a large acceleration is applied during the transportation of the display panel, there are cases where a corner of the display panel is cracked. According to the studies made by the present inventor, this problem is caused because when a large acceleration (force) is applied to the corner protection member, the corner protection member rotates, as described below (this problem may be referred to as "problem 2").

In the above, the container accommodating the display panel is described. However, neither problem 1 nor problem 2 is limited to occurring in the case where the container accommodates a display panel, but may occur in the case where the container accommodates a rectangular plate-like object formed of a material that is easily cracked or chipped away (e.g., a glass plate or a plastic plate).

The present invention has an object of providing a container capable of suppressing breakage of an accommodated object, and suppressing a decrease in the working efficiency, during the removal of the accommodated object (solving problem 1) and/or capable of suppressing a corner of the accommodated object from being cracked or chipped away when a large acceleration is applied to the accommodated object (solving problem 2).

Solution to Problem

A container according to an embodiment of the present invention includes an accommodation member including a bottom surface member defining a bottom surface of an accommodation space having four corners and also including a side surface member defining side surfaces of the accommodation space, the bottom surface member defining an xy plane and the side surface member defining an xz plane and a yz plane both perpendicular to the xy plane; and two protection members each having a first receiving surface and a second receiving surface that are to be in contact with an object to be accommodated in the accommodation space and are respectively parallel to the yz plane and the xz plane. The side surface member includes two cutout portions respectively facing two corners adjacent to each other among the four corners of the accommodation space. Each of the two protection members includes an inner member including a receiving portion having the first receiving surface and the second receiving surface and also includes an outer member located at least between the inner member and a side surface, of the side surface member, that is parallel to the yz plane, the outer member being fit to the inner member so as to be slidable in a certain direction crossing the bottom surface. The two protection members are respectively located in the two cutout portions in a state where the inner member and the outer member included in each of the two protection members are detachable in the certain direction independently. A portion, of the inner member, that includes the first receiving surface is more easily warped than a portion, of the inner member, that includes the second receiving surface.

In an embodiment, where an intersection, on the xy plane, of a plane including the first receiving surface and a plane including the second receiving surface is the origin, a distance from the origin to the center of the first receiving surface in a y direction is dcy, and a distance from the origin to the center of the second receiving surface in an x direction is dcx, the container fulfills $dcy > 1.5 \cdot dcx$.

In an embodiment, the inner member is formed of a non-expanded plastic material, and the portion of the inner member including the first receiving surface has a thickness of 3 mm or less.

In an embodiment, the inner member further includes a wall provided along an end side of the receiving portion in a $-y$ direction, the wall protruding in a $-x$ direction.

In an embodiment, the outer member is formed of an expanded plastic material.

In an embodiment, the inner member further includes a support portion formed adjacent to the receiving portion in a y direction and having a support surface parallel to the xz plane, and the support surface protrudes in an x direction more than the second receiving surface.

In an embodiment, the support surface of the inner member is contactable with a side surface, of the side surface member, that is parallel to the xz plane.

In an embodiment, the support surface of the inner member and a side surface, of the outer member, that is parallel to the xz plane are substantially flush with each other.

In an embodiment, the outer member is also located between the support surface and a side surface, of the side surface member, that is parallel to the xz plane.

In an embodiment, the receiving portion of the inner member has a bottom surface in contact with the bottom surface member and parallel to the xy plane. A bottom surface, of the support portion, facing the bottom surface member and parallel to the xy plane is not in contact with the bottom surface member.

In an embodiment, a length of the receiving portion in a z direction is longer than a length of the support portion in the z direction.

In an embodiment, the center of gravity of the inner member is present outer to the bottom surface of the receiving portion as seen in a z direction.

In an embodiment, the container further includes a protection sheet provided on each of the two receiving surfaces of the inner member, and the protection sheet is formed of a non-expanded plastic material harder than the material of the inner member.

In an embodiment, the accommodation member is formed of an expanded plastic material having a hardness equal to that of the expanded plastic material of the outer member or an expanded plastic material softer than the expanded plastic material of the outer member.

In an embodiment, when the outer member is detached, the inner member falls toward a space where the outer member was present before being detached.

In an embodiment, the outer member is fit to the inner member so as to be slidable in a z direction.

In an embodiment, the inner member includes a plurality of ribs parallel to the xz plane, and the outer member includes a plurality of grooves parallel to the xz plane.

In an embodiment, the inner member and the outer member each have a plane of symmetry parallel to the xy plane.

Advantageous Effects of Invention

An embodiment of the present invention provides a container capable of suppressing breakage of an accommodated object, and suppressing a decrease in the working efficiency, during the removal of the accommodated object and/or capable of suppressing a corner of the accommodated object from being cracked or chipped away when a large acceleration is applied to the accommodated object.

BRIEF DESCRIPTION OF DRAWINGS

FIG. 1(a) is a schematic perspective view of a container 100 according to an embodiment of the present invention, and FIG. 1(b) is a schematic perspective view of a liquid crystal display panel module 200 to be accommodated in the container 100.

FIG. 2(a) is a schematic perspective view showing a state where a protection member 20a is attached to a cutout portion 15a of an accommodation member 10 of the container 100, and FIG. 2(b) is a schematic perspective view showing a state where an outer member 32a of the protection member 20a is detached.

FIG. 3(a) is a schematic perspective view showing a state where an inner member 22a of the protection member 20a falls in a y direction, and FIG. 3(b) is a schematic perspective view showing a state where the inner member 22a of the protection member 20a falls in a −x direction.

FIG. 5(a) is a schematic perspective view of the outer member 32a, and FIG. 5(b) is a schematic perspective view of the protection member 20a in a state where the inner member 22a is fit to the outer member 32a.

FIG. 6 is a schematic perspective view showing a state of the protection member 20a attached to the cutout portion 15a.

FIG. 7 provides schematic views provided to describe a protection member 120a usable in a container according to another embodiment of the present invention; FIG. 7(a) is a schematic perspective view of an outer member 132a, and FIG. 7(b) is a schematic perspective view of the protection member 120a in a state where the inner member 22a is fit to the outer member 132a.

FIG. 8 is a schematic plan view of the protection member 120a.

FIG. 9(a) is a schematic perspective view of the inner member 122a, FIG. 9(b) is a schematic plan view of the inner member 122a as seen in the z direction, FIG. 9(c) is a schematic plan view of the inner member 22a as seen the −x direction, and FIG. 9(d) is a schematic plan view of the inner member 122a as seen the x direction.

FIG. 12 provides schematic views illustrating a protection member 220a; FIG. 12(a) is a schematic perspective view of an outer member 232a, and FIG. 12(b) is a schematic perspective view of the protection member 220a in a state where the inner member 122a is fit to the outer member 232a.

FIG. 13 is a schematic plan view of the protection member 220a.

FIG. 14 is a schematic perspective view of a container 900 in the comparative example and is provided to describe problem 2 caused by the protection member 92a.

DESCRIPTION OF EMBODIMENTS

Figure 14:
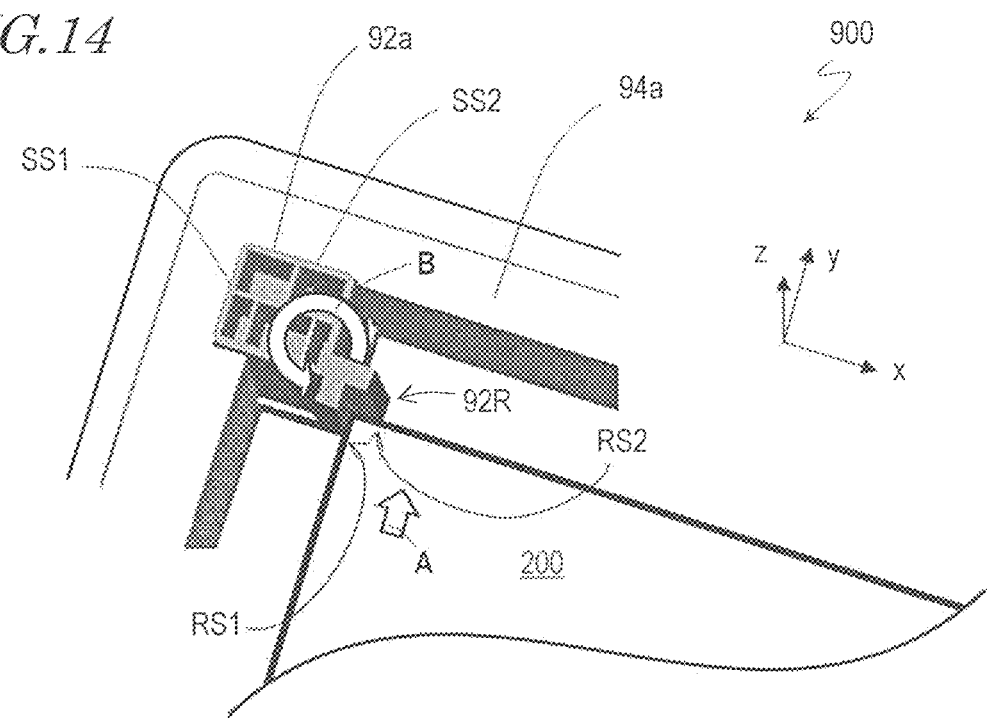

First, with reference to FIG. 14, problem 2 of the conventional container, including the corner protection member, described in Patent Document No. 1 will be described. FIG. 14 is a schematic perspective view of a container 900 including a protection member 92a having substantially the same structure as that of the corner protection member described in Patent Document No. 1.

The protection member 92a is integrally formed of a non-expanded resin. Two receiving surfaces RS1 and RS2 of a receiving portion 92R are in contact with a corner of a panel module 200, and thus the protection member 92a holds the panel module 200 such that the panel module 200 does not move in an xy plane. The receiving surface RS1 is parallel to a yz plane, whereas the receiving surface RS2 is parallel to an xz plane.

When, for example, an acceleration is applied to the panel module 200 in a y direction as represented by arrow A as shown in FIG. 14, a force acts on the protection member 92a to rotate the protection member 92a counterclockwise as represented by arrow B. Since the receiving surface RS2 of the protection member 92a protrudes in an x direction more than a support surface SS2, the moment of force acting on the receiving surface RS2 so as to rotate the protection member 92a is large. Therefore, a side surface member 94a cannot stop the rotation of the protection member 92a, and the protection member 92a rotates. The side surface member 94a of the container 900 is formed of an expanded resin, and protection member 92a is formed of a material harder than that of the side surface member 94a. Therefore, the side surface member 94a may possibly be crushed by the protection member 92a. When the protection member 92a rotates, the panel module 200 cannot be held stably. This increases the frequency at which the panel module 200 is cracked or chipped away.

A container according to an embodiment of the present invention solves problem 1 that the accommodated object is broken, or the working efficiency is decreased, during the removal of the accommodated object and/or problem 2 that the corner of the accommodated object is cracked or chipped away when a large acceleration is applied to the accommodated object.

Hereinafter, a container according to an embodiment of the present invention will be described with reference to the drawings. In the following, a container that accommodates a liquid crystal display panel module will be described as an example. An embodiment of the present invention is not limited to the following example. It should be noted that an embodiment of the present invention is directed to a container preferably usable to accommodate an object, like a liquid crystal display panel module, that cannot be supported by four sides but needs to be supported at corners and is formed of a material that is easily cracked or chipped away (glass or a plastic material). An embodiment of the present invention is especially directed to a container preferably usable to transport a liquid crystal display panel module.

FIG. 1(a) is a schematic perspective view of a container 100 according to an embodiment of the present invention. FIG. 1(b) is a schematic perspective view of a liquid crystal display panel module (hereinafter, referred to as the "panel module") 200, which is to be accommodated in the container 100.

The container 100 includes an accommodation member 10 including a bottom surface member 12 defining a bottom surface of an accommodation space 10s and a side surface member 14 (14a, 14b, 14c and 14d; defining side surfaces of the accommodation space 10s, and also includes protection members 20a, 20b, 20c and 20d located in the accommodation space 10s and having receiving surfaces to be in contact with an object to be accommodated in the accommodation space 10s. The accommodation space 10s has four corners. The side surface member 14 includes cutout portions 15a, 15b, 15c and 15d respectively facing the four corners. The protection members 20a, 20b, 20c and 20d are respectively located in the cutout portions 15a, 15b, 15c and 15d. A lid 70 is optional and may be omitted. The bottom surface member 12 defines an xy plane, and the side surface member 14 defines an xz plane and a yz plane both perpendicular to the xy plane.

In this example, four protection members 20a, 20b, 20c and 20d are respectively located at the four corners of the accommodation space 10s. In the case where a circuit board 204 is mounted on only one side of a liquid crystal display panel (hereinafter, referred to as the "panel") 202, like in the case of the panel module 200, only the cutout portions 15a and 15b facing at least two adjacent corners, among the four corners, may be provided and the protection members 20a and 20b may be located only in the cutout portions 15a and 15b. Instead of the cutout portions 15c and 15d, a protection member that supports, for example, a side of the panel 202 may be located.

The panel module 200 is located in the accommodation space 10s of the container 100. A plurality of (e.g., 10 to 20) panel modules 200 may be located in a stacked manner. In this case, a cushioning sheet (e.g., expanded polyethylene (EPE) sheet; thickness: for example, 1 mm) may be held between the panel modules 200. It is preferred that the cushioning sheet is smaller by several millimeters to about 10 mm than an outer shape of the panel 202. Another container 100 may be stacked on the container 100 accommodating the panel module(s) 200. It is preferred that a bottom surface of the side surface member 14 of the container 100 has a stepped portion (not shown) engageable with a stepped portion 14s provided at a top surface of the side surface member 14. It is preferred that a bottom surface of the lid 70 has a stepped portion (not shown) engageable with the stepped portion 14s provided at the top surface of the side surface member 14.

Now, FIG. 2 will be referred to. FIG. 2(a) is a schematic perspective view showing a state where the protection member 20a is attached to the cutout portion 15a of the accommodation member 10 of the container 100. FIG. 2(b) is a schematic perspective view showing a state where an outer member 32a of the protection member 20a is detached. The protection members 20b, 20c and 20d each have an equivalent structure to that of the protection member 20a. Thus, the protection member 20a will be described as an example, hereinafter.

The protection member 20a includes an inner member 22a having receiving surfaces to be in contact with the panel module 200, and the outer member 32a located between the inner member 22a and the side surface member 14 (14a and 14b). The outer member 32a is fit to the inner member 22a so as to be slidable in a z direction. The inner member 22a and the outer member 32a are located in the cutout portion 15a while being detachable in the z direction independently. In this example, the outer member 32a is fit to the inner member 22a so as to be slidable in the z direction. The outer member 32a is not limited to being slidable in the z direction, and may be slidable any direction crossing the bottom surface.

The protection member 20a has a generally parallelepiped shape as a whole. The outer member 32a has side surfaces parallel to the xz plane and the yz plane (side surface 33sb and side surface 34s shown in FIG. 5(a)) and a top surface and a bottom surface both parallel to the xy plane. The outer member 32a is located in the cutout portion 15a such that the side surfaces of the outer member 32a that are parallel to the xz plane and the yz plane are in contact with side surfaces of the cutout portion 15a that are parallel to the xz plane and the yz plane.

The inner member 22a is fittable to the outer member 32a. While the inner member 22a is located in the cutout portion 15a, two receiving surfaces of the inner member 22a are parallel to the xz plane and the yz plane and are in contact with a corner of the panel module 200 (panel 202), and the inner member 22a holds the panel module 200 together with the inner members of the other three protection members 20b, 20c and 20d such that the panel module 200 does not move in the xy plane. As shown in FIG. 2(b), when the outer member 32a is slid in the z direction to be detached from the cutout portion 15a, a space into which at least a part of the inner member 22a may be retracted is formed in an area of the cutout portion 15a where the outer member 32a was present before being detached.

In the example described herein, as a structure that allows at least a part of the inner member 22a to be retracted into the space where the outer member 32a was present before being detached, a structure that when the outer member 32a is detached, allows the inner member 22a to fall toward the space where the outer member 32a was present before being detached is adopted. The inner member 22a in this example cannot stand itself in a state where the two receiving surfaces are parallel to the z direction, and fall in a direction away from the panel module 200. Therefore, the inner member 22a falls toward the space where the outer member 32a was present before being detached. The inner member 22a may be set to fail in the y direction as shown in FIG. 3(a) or may be set to fail in a −x direction as shown in FIG. 3(b). Needless to say, the inner member 22a may be set to fall either in the −x direction or in the y direction.

It should be noted that even if the container 100 does not include the structure shown here as an example, more specifically, the structure that when the outer member 32a is detached, allows the inner member 22a to fail toward the space where the outer member 32a was present before being detached, at least the effect that, as described below, a cracked or chipped away is provided.

Referring to FIG. 3(a) and FIG. 3(b), a recessed portion or the like formed in the side surface member 14 (14b) is provided in order to decrease the weight of the side surface member 14 and/or the amount of the material of the side surface member 14. Such a technique is well known in the field of plastic processing, and thus will not be described herein.

When the inner member 22a falls in a direction away from the panel module 200 as described above, a sufficiently large gap is formed between the panel module 200 and the inner member 22a. Therefore, during the removal of the panel module 200 from the accommodation space 10s, the corner of the panel module 200 (panel 202) is suppressed from contacting the inner member 22a. In addition, there is no component that supports the inner member 22a. Therefore, even if the inner member 22a does not fall in a direction away from the panel module 200 for some reason and as a result, the panel module 200 contacts the inner member 22a, no force that may break the panel module 200 is applied to the panel module 200. With such a structure, during the removal of the panel module 200, the problem does not occur that the panel module 200 is broken as a result of contacting the inner member 22a, or that the working efficiency is decreased by an attempt to prevent the breakage. For example, a robot may be used to automatically remove the panel module 200 from the container 100.

In a state where the protection member 20a is attached to the cutout portion 15a, it is preferred that the clearance between the above-described side surfaces of the outer member 32a and the above-described side surfaces of the cutout portion 15a is small. For example, the side surfaces of the outer member 32a and the side surfaces of the cutout portion 15a may be in contact with each other as long as the outer member 32a is easily detached from the cutout portion 15a while being nipped by a hand of a user. The clearance between one of the receiving surfaces of the inner member 22a and the panel module 200 is, for example, about 1 mm to about 3 mm in the case where, for example, the panel module 200 is of a 60-inch type. The clearances may be set to be small as described above, so that the panel module 200 is suppressed from moving in a plane parallel to the xy plane while being transported.

In addition, the protection member 20a includes the inner member 22a and the outer member 32a separable from each other. Therefore, even if, for example, a large acceleration is caused to the panel module 200 in the xy plane by sudden braking or the like during the transportation and as a result, a large impact is applied to the receiving surfaces, the protection member 20a exhibits a larger effect of absorbing the impact than the protection member 92a in the comparative example, which is of a single component. This contributes to the effect described below that a corner of the accommodated object is suppressed from cracked or chipped away.

Now, with reference to FIG. 4(a) through FIG. 4(d), FIG. 5(a) and FIG. 5(b), an example of the inner member 22a and the outer member 32a will be described in detail. FIG. 4(a) is a schematic perspective view of the inner member 22a. FIG. 4(b) is a schematic plan view of the inner member 22a as seen in the z direction. FIG. 4(c) is a schematic plan view of the inner member 22a as seen the −x direction. FIG. 4(d) is a schematic plan view of the inner member 22a as seen the x direction. FIG. 5(a) is a schematic perspective view of the outer member 32a. FIG. 5(b) is a schematic perspective view of the protection member 20a in a state where the inner member 22a is fit to the outer member 32a.

As shown in FIG. 4(a), the inner member 22a includes a receiving portion 22R having receiving surfaces 23 and 24, and a support portion 22S formed adjacent to the receiving portion 22R in the y direction and having a support surface 22Sa parallel to the xz plane. The support portion 22S includes a plurality of ribs 25a, 25b and 25c parallel to the xz plane. The support portion 22S also includes a plurality of (five in this example) ribs 28a parallel to the xy plane. The ribs 28a reinforce the support portion 22S and support the receiving surface 24. Therefore, the receiving surface 24 is not easily warped (elastically deformed) even if being supplied with an acceleration (force) in the y direction. Optional protection sheets 27a and 27b are respectively provided on the receiving surfaces 23 and 24. The protection sheets 27a and 27b may be omitted.

As shown in FIG. 5(a), the outer member 32a includes a plurality of grooves 35a, 35b and 35c parallel to the xz plane. The ribs 25a, 25b and 25c of the inner member 22a are respectively inserted into the grooves 35a, 35b and 35c of the outer member 32a, and as a result, the inner member 22a and the outer member 32a are fit to each other. In a state where the inner member 22a and the outer member 32a are fit to each other, the support surface 22Sa of the inner member 22a is in contact with a side surface 33sa, of the outer member 32a, parallel to the xz plane (see FIG. 5(b)). In addition, a rear surface of the receiving portion 22R (surface opposite to the receiving surface 23) of the inner member 22a is in contact with a portion 37 of the outer member 32a.

A bottom surface 22Rb, of the receiving portion 22R, parallel to the xy plane is in contact with the bottom surface member 12. By contrast, a bottom surface 22Sb, of the support portion 22S, facing the bottom surface member 12 and parallel to the xy plane is not in contact with the bottom surface member 12. Namely, length Z1 of the receiving portion 22R in the z direction is longer than length Z2 of the support portion 22S in the z direction, and only the bottom surface 22Rb of the receiving portion 22R is in contact with the bottom surface member 12.

As shown in FIG. 4(b), the inner member 22a is structured such that the center of gravity thereof is present outer to the bottom surface 22Rb of the receiving portion 22R as seen in the z direction. The center of gravity, as seen in the z direction of the inner member 22a may be shifted from the bottom surface 22Rb of the receiving portion 22R in the −x direction, in the y direction, or both of the −x direction and the y direction. Since the center of gravity of the inner member 22a is shifted from the bottom surface 22Rb of the receiving portion 22R as described above, the inner member 22b cannot stand itself on the bottom surface member 12 and falls in a direction in which the center of gravity thereof is shifted.

The position of the center of gravity of the inner member 22a may be adjusted by, for example, the shape of the support portion 22S. For example, the rib 25a may be protruded to be inserted deep into the groove 35a of the outer member 32a, so that the center of gravity of the inner member 22a is shifted in the −x direction.

The structure to cause the inner member 22a to fall in the −x direction or in the y direction may be modified in any of various manners. For example, a protrusion may be provided on the bottom surface 22Rb of the receiving portion 22R. Even with the structure in which the protrusion is provided on the bottom surface 22Rb, the receiving surfaces 23 and 24 may be located to be parallel to the z direction in a state where the inner member 22a is fit to the outer member 32a.

Ribs 26a are provided on the rear surface of the receiving portion 22R of the inner member 22a (provided on the surface opposite to the receiving surface 23, i.e., surface in contact with the outer member 32a). Therefore, the receiving surface 23 is not easily warped (elastically deformed) even if being supplied with an acceleration (force) in the −x direction. The ribs 26a shown in this example include two ribs extending parallel to the z direction and one rib extending parallel to the y direction so as to cross centers of these two ribs. The ribs are not limited to having such a structure, and may include, for example, two or more ribs extending parallel to the y direction. The receiving portion 22R including the ribs 26a have a thickness (length in the x direction) of, for example, about 10 mm. The receiving surface 24 is supported by the support portion 22S, and therefore, is not easily warped (elastically deformed) even if being supplied with an acceleration (force) in the y direction.

As shown in FIG. 5(a), the outer member 32a has the side surface 33sb parallel to the xz plane and the side surface 34s parallel to the yz plane. The outer member 32a is located such that the side surface 33sb and the side surface 34s are respectively in contact with the side surfaces, of the cutout portion 15a of the side surface member 14, that are parallel to the xz plane and the yz plane, and such that the bottom surface of the outer member 32a parallel to the xy plane is in contact with the bottom surface member 12. A portion 33 of the outer member 32a is located between the inner member 22a and the side surface member 14a, and a portion 34 of the outer member 32a is located between the inner member 22a and the side surface member 14b (see, for example, FIG. 2(a)). The outer member 32a supports the receiving surfaces 23 and 24 of the inner member 22a such that the receiving surfaces 23 and 24 are parallel to the z direction, and decreases the impact applied from the inner member 22a to the side surface member 14. The outer member 32a does not need to have the bottom surface parallel to the xy plane. A reason for this is that the outer member 32a is in contact with the side surfaces, of the cutout portion 15a of the side surface member 14, that are parallel to the xz plane and the yz plane and thus is located such that the side surface 33sb and the side surface 34s are parallel to the z direction.

The outer member 32a further includes recessed portions 38a and 38b. The recessed portions 38a and 38b are provided such that in a state where the outer member 32a is located in the cutout portion 15a, hollows are formed between the outer member 32a and the side surface member 14. For detaching the outer member 32a located in the cutout portion 15a, fingertips may be inserted into the hollows formed between the outer member 32a and the side surface member 14. Thus, the outer member 32a may be nipped easily with the fingers.

As represented by the dashed line in, for example, FIG. 4(c) and FIG. 4(d), the inner member 22a has a plane of symmetry SP parallel to the xy plane. Similarly, the outer member 32a has a plane of symmetry parallel to the xy plane. With such a structure, common inner members 22a and common outer members 32a may be used to form the four protection members 20a, 20b, 20c and 20d.

As described above, the container 100 according to an embodiment of the present invention includes the protection members 20a, 20b, 20c and 20d, and therefore, suppresses the breakage and the decrease in the working efficiency during the removal of the object accommodated in the container 100 (solves problem 1).

The container 100 according to an embodiment of the present invention includes the protection members 20a, 20b, 20c and 20d, and therefore, suppresses the accommodated object from being cracked or chipped away at a corner thereof when a large acceleration is applied to the accommodated object (solves problem 2). Mow, this will be described.

Figure 6:
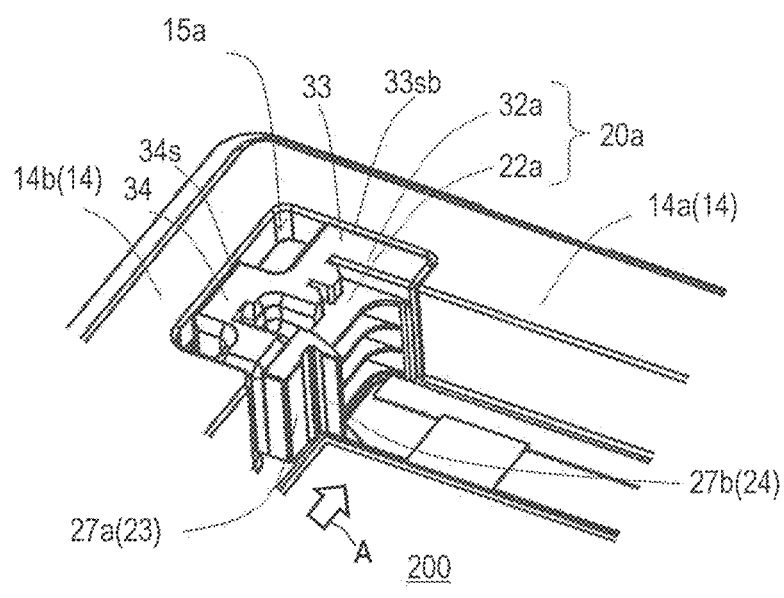

With reference to FIG. 4(a), FIG. 4(b), FIG. 5(a), FIG. 5(b) and FIG. 6, a structure of a portion at which the protection member 20a is in contact with the side surface member 14 will be described. FIG. 6 is a schematic-perspective view showing a state of the protection member 20a attached to the cutout portion 15a.

Figure 4:
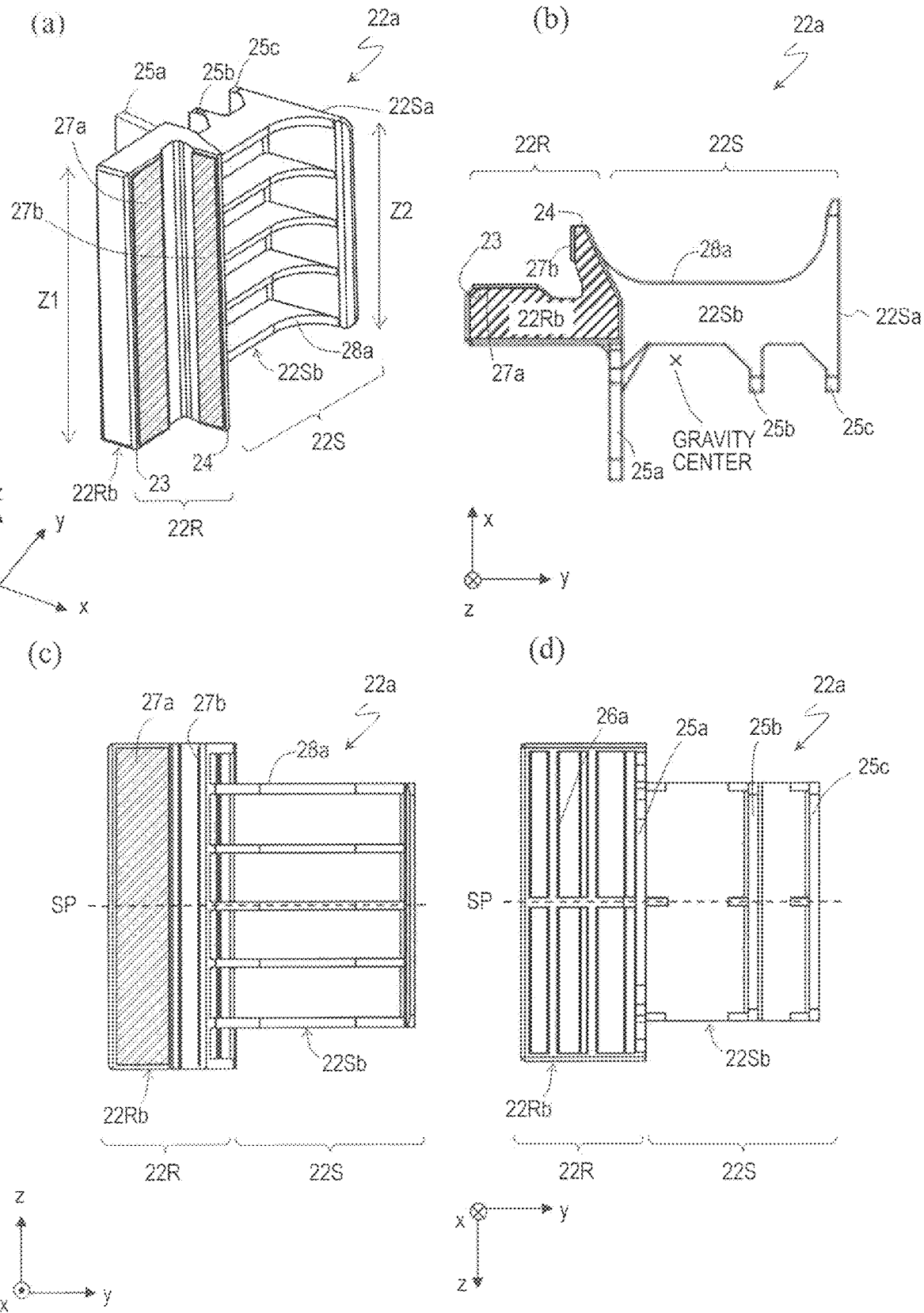
FIG. 4(a) is a schematic perspective view of the inner member 22a, FIG. 4(b) is a schematic plan view of the inner member 22a as seen in a z direction.
FIG. 4(c) is a schematic plan view of the inner member 22a as seen the −x direction.
FIG. 4(d) is a schematic plan view of the inner member 22a as seen an x direction.

As shown in FIG. 4 (a) and FIG. 4(b), the inner member 22a includes the receiving portion 22R and the support portion 22S formed adjacent to the receiving portion 22R in the y direction. The receiving portion 22R has the receiving surface 23 parallel to the yz plane and the receiving surface 24 parallel to the xz plane. The support portion 22S has the support surface 22Sa parallel to the xz plane. The support surface 22Sa protrudes in the x direction more than the receiving surface 24 parallel to the xz plane.

The inner member 22a and the outer member 32a are fit to each other. In a state where the inner member 22a and the outer member 32a are fit to each other, the support surface 22Sa of the inner member 22a is entirety in contact with the side surface 33sa, of the outer member 32a, parallel to the xz plane (see FIG. 5(b)).

As shown in FIG. 6, the outer member 32a is located such that the side surface 33sb and the side surface 34s are respectively in contact with the side surfaces, of the cutout portion 15a of the side surface member 14, that are parallel to the xz plane and the yz plane. The portion 33 of the outer member 32a is located between the inner member 22a and the side surface member 14a, whereas the portion 34 of the outer member 32a is located between the inner member 22a and the side surface member 14b. The outer member 32a supports the receiving surfaces 23 and 24 of the inner member 22a such that the receiving surfaces 23 and 24 are parallel to the z direction, and decreases the impact applied from the inner member 22a to the side surface member 14.

The support surface 22Sa of the inner member 22a and the side surface 33sb of the outer member 32a protrude in the x direction more than the receiving surface 24 parallel to the xz plane. Therefore, even if an acceleration is applied to the panel, module 200 in the y direction as represented by arrow A and as a result, a force acts on the protection member 20*a* so as to rotate the protection member 20*a* counterclockwise, the side surface 33*sb* of the outer member 32*a* receives a reaction from the side surface member 14, and as a result, the protection member 20*a* does not rotate.

As described above with reference to FIG. 14, in the protection member 92*a* included in the container 900 in the comparative example, the receiving surface RS2 protrudes in the x direction more than the support surface SS2. Therefore, the moment of force acting on the receiving surface RS2 so as to rotate the protection member 92*a* counterclockwise is large. Therefore, the reaction received by the support surface SS2 from the side surface member 94*a* cannot suppress the rotation of the protection member 92*a*.

Similarly, the protection member 92*a* has a problem of rotating clockwise when being supplied with an acceleration in the −z direction. A reason for this is that the receiving surface RS1 protrudes in a −y direction more than the support surface SS1. By contrast, as shown in FIG. 6, the receiving surface 23 of the protection member 20*a* is supported by the portion 34, of the outer member 32*a*, located between the inner member 22*a* and the side surface member 14*b*. Therefore, the protection member 20*a* is suppressed from rotating even if being supplied with an acceleration in the −x direction.

Figure 8:
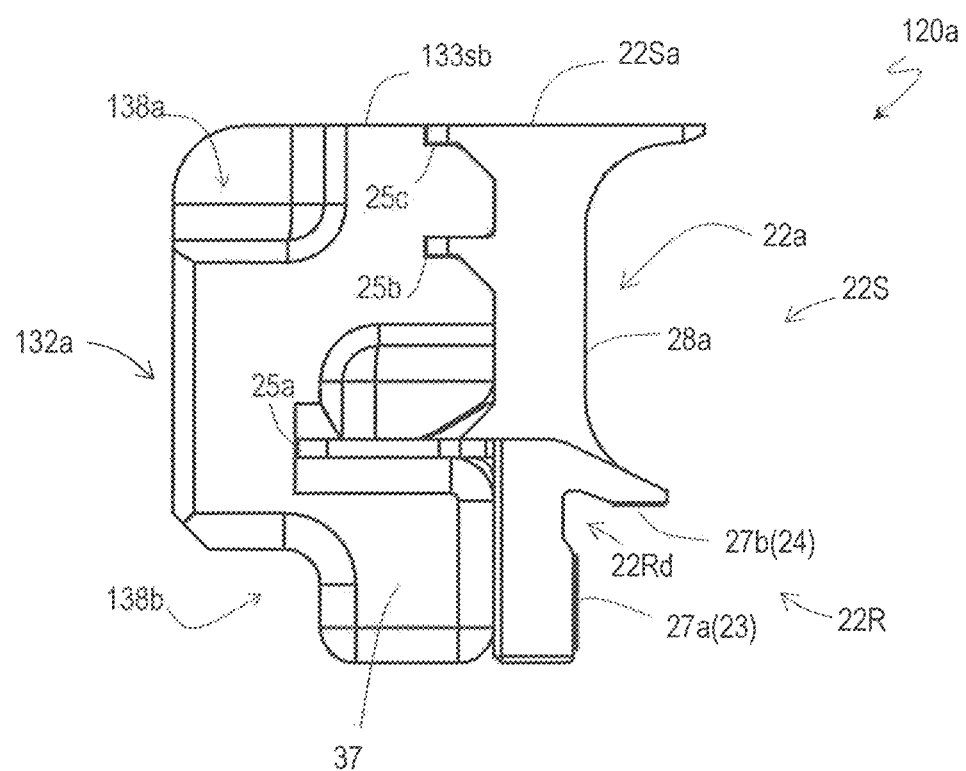

With reference to FIG. 7(*a*), FIG. 7(*b*) and FIG. 8, a protection member 120*a* usable in a container according to another embodiment of the present invention will be described. FIG. 7(*a*) is a schematic perspective view of an outer member 132*a* included in the protection member 120*a*. FIG. 7(*b*) is a schematic perspective view of the protection member 120*a* in a state where the inner member 22*a* is fit to the outer member 132*a*. FIG. 8 is a schematic plan view of the protection member 120*a*.

The protection member 120*a* includes the outer member 132*a* and the inner member 22*a*. Namely, unlike the outer member 32*a* described above, the outer member 132*a* of the protection member 120*a* does not include the portion 33 located between the inner member 22*a* and the side surface member 14*a*. Except for this, the structure of the outer member 132*a* is the same as that of the outer member 32*a*. For reference signs representing components of the outer member 132*a*, "100" will be added to the reference signs representing the corresponding components of the outer member 32*a*.

As shown in FIG. 7(*a*), the outer member 132*a* has a side surface 133*sb* parallel to the xz plane, and a side surface 134*s* parallel to the yz plane. The outer member 132*a* is located such that the side surface 133*sb* and the side surface 134*s* are respectively in contact with side surfaces, of the cutout portion 15*a* of the side surface member 14, that are parallel to the xz plane and the yz plane, and such that a bottom surface of the outer member 132*a* parallel to the xy plane is in contact with the bottom surface member 12. A portion 134 of the outer member 132*a* is located between the inner member 22*a* and the side surface member 14*b*. The outer member 132*a* further includes recessed portions 138*a* and 138*b*. The recessed portions 138*a* and 138*b* are provided such that in a state where the outer member 132*a* is located in the cutout portion 15*a*, hollows are formed between the outer member 132*a* and the side surface member 14.

As shown in FIG. 7(*a*), the outer member 132*a* includes a plurality of grooves 135*a* and 135*b* and a cutout 135*c* parallel to the xz plane. As shown in FIG. 7(*b*) and FIG. 8, the ribs 25*a*, 25*b* and 25*c* of the inner member 22*a* are respectively inserted into the plurality of grooves 135*a* and 135*b* and the cutout 135*c* of the outer member 132*a*, and as a result, the inner member 22*a* and the outer member 132*a* are fit to each other. The rear surface of the receiving portion 22R (surface opposite to the receiving surface 23) of the inner member 22*a* is in contact with a portion 137 of the outer member 132*a*.

In a state where the inner member 22*a* and the outer member 132*a* are fit to each other, the support surface 22Sa of the inner member 22*a* is substantially flush with the side surface 133*sb*, of the outer member 132*a*, parallel to the xz plane. The expression that "the support surface 22Sa of the inner member 22*a* and the side surface 133*sb* of the outer member 132*a* are substantially flush with each other" indicates that the support surface 22Sa and the side surface 133*sb* are flush with each other to such a degree that the support surface 22Sa and the side surface 133*sb* may both be in contact with the side surface, of the side surface member 14, that is parallel to the xz plane. The protection member 120*a*, when being attached to the cutout portion 15*a*, is located such that the support surface 22Sa of the inner member 22*a* and the side surface 133*sb* of the outer member 132*a* are in contact with the side surface, of the side surface member 14, that is parallel to the xz plane. The support surface 22Sa of the inner member 22*a* protrudes in the x direction more than the receiving surface 24 parallel to the xz plane. Therefore, like in the case of the protection member 20*a* shown in FIG. 6, even if an acceleration is applied to the panel module 200 in the y direction, and as a result, a force acts on the protection member 120*a* so as to rotate the protection member 120*a* counterclockwise, the support surface 22Sa of the inner member 22*a* and the side surface 133*sb* of the outer member 132*a* receive a reaction from the side surface member 14, and as a result, the protection member 120*a* does not rotate.

It is preferred that length Z3 of the outer member 132*a* in the z direction fulfills the relationship of $Z2 \leq Z3 \leq Z1$ where Z2 is the length of the support portion 22S in the z direction and Z1 is the length of the receiving portion 22R in the z direction. Now, it is assumed that, for example, the relationship $Z3=(Z1+Z2)/2$ is fulfilled. In this case, when the bottom surface (parallel to the xy plane) of the outer member 132*a* is in contact with the bottom surface member 12, a top surface of the outer member 132*a* and a top surface of the support portion 22S of the inner member 22*a* are flush with each other (see FIG. 7(*b*)) in a state where the bottom surface 22Rb (parallel to the xy plane) of the receiving portion 22R of the inner member 22*a* is in contact with the bottom surface member 12. With such sizes, it is easy to set the protection member 120*a* at a predetermined position, and it is also easy to confirm that the protection member 120*a* is set accurately at the predetermined position. This is also applicable to the outer member 32*a* (see FIG. 5(*a*)) described above.

Unlike in the protection member 20*a*, in the protection member 120*a*, the outer member 132*a* covers only one surface of the inner member 22*a* (covers only the surface directed toward the side surface member 14*b*). This provides an advantage that the outer member 132*a* is easily detachable. The structure of the outer member 132*a* is simpler than that of the outer member 32*a*, which provides an advantage that the outer member 132*a* is difficult to be broken and is easy to foe produced.

Figure 9:
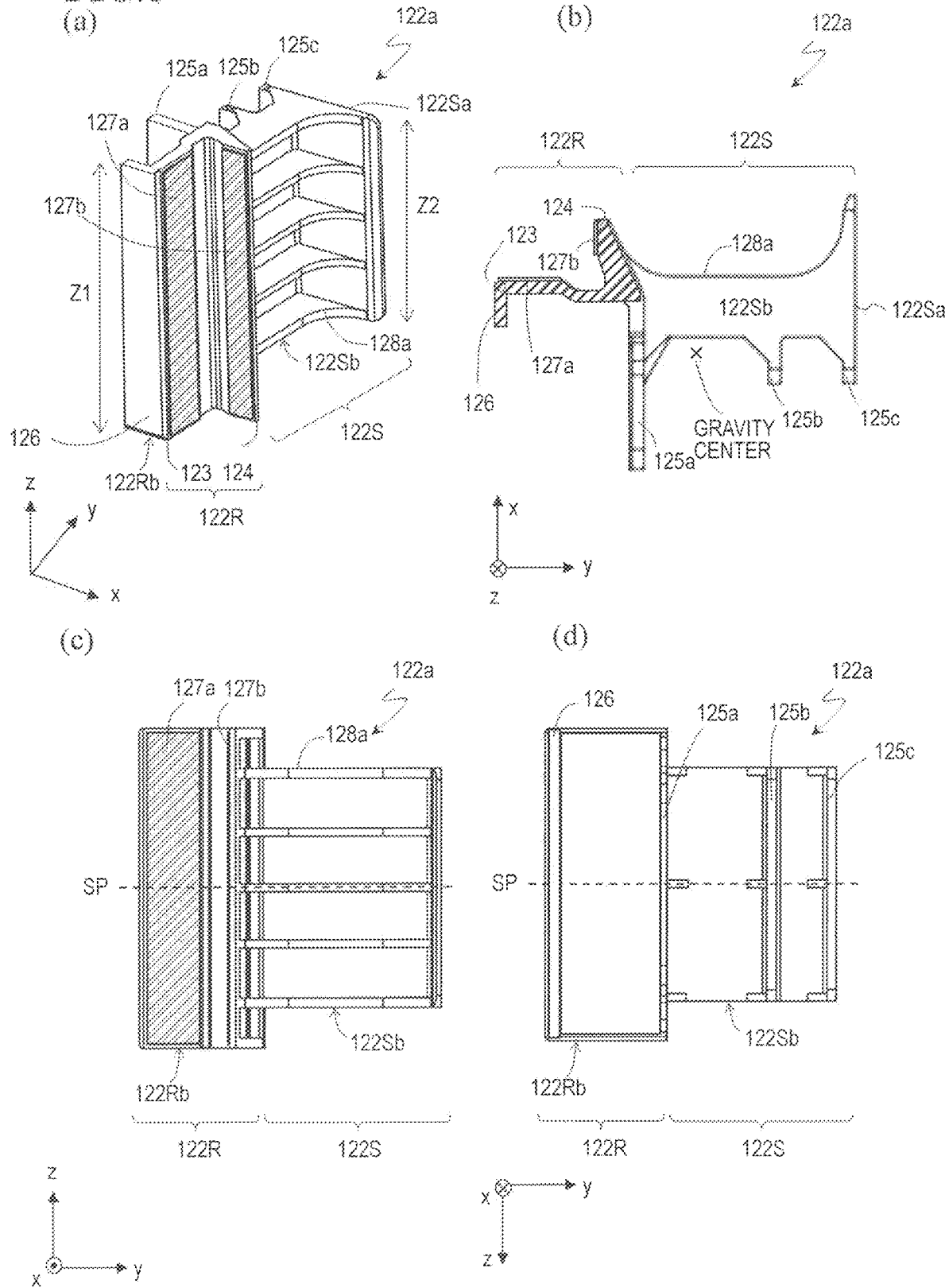
FIG. 9 provides views showing an inner member 122a included in a protection member usable in a container according to still another embodiment of the present invention.

Now, with reference to FIG. 9 through FIG. 13, a protection member 220*a* usable in a container according to still another embodiment of the present invention will be described. FIG. 9(*a*) through FIG. 9(*d*) each show an inner member 122*a* included in the protection member 220*a*. FIG.

Figure 10:
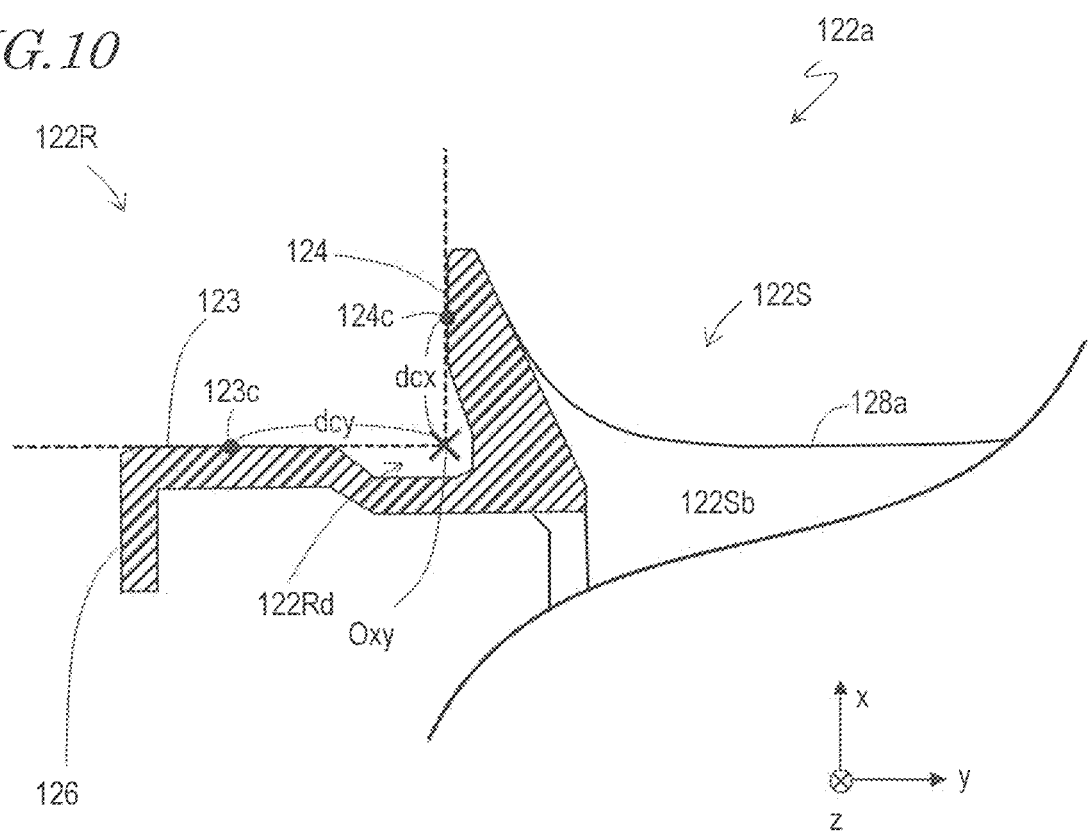
FIG. 10 is a schematic plan view of a receiving portion 122R of the inner member 122a as seen in the z direction.
Figure 11:
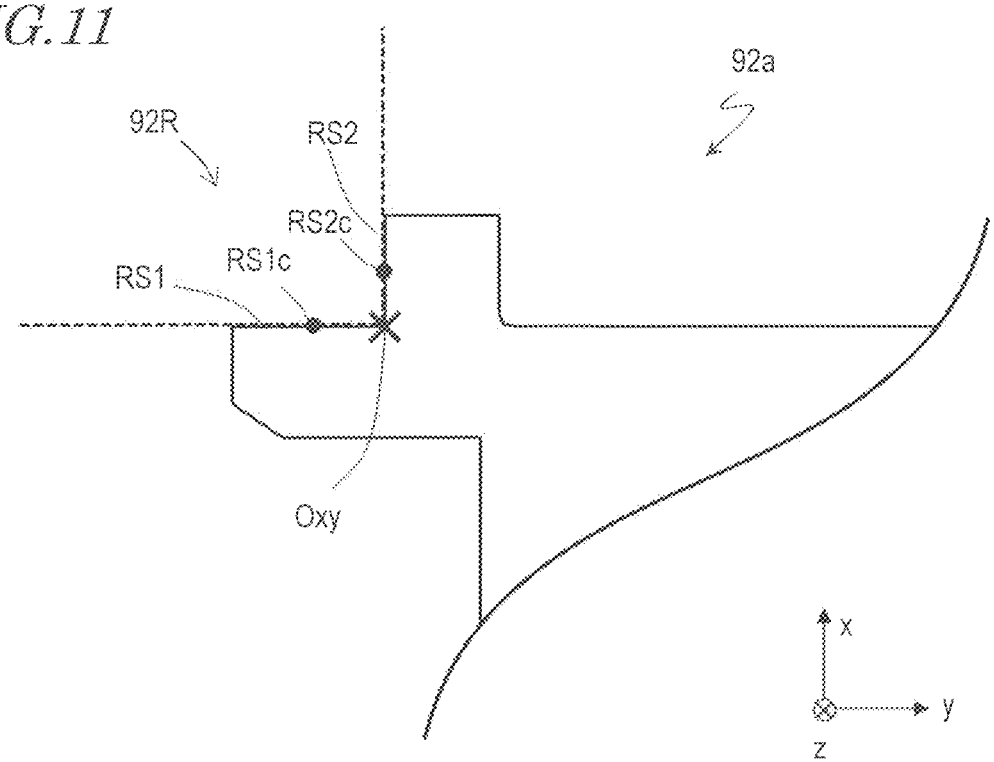
FIG. 11 is a schematic plan view of a receiving portion 92R of a protection member 92 in a comparative example as seen in the z direction.

9(a) is a schematic perspective view of the inner member 122a. FIG. 9(b) is a schematic plan view of the inner member 122a as seen in the z direction. FIG. 9(c) is a schematic plan view of the inner member 122a as seen the −x direction. FIG. 9(d) is a schematic plan view of the inner member 122a as seen the x direction. FIG. 10 is a schematic plan view of a receiving portion 122R of the inner member 122a as seen in the z direction. FIG. 11 is a schematic plan view of the receiving portion 92R of the protection member 92 in the comparative example as seen in the z direction.

First, a structure of the inner member 122a will foe described with reference to FIG. 9(a) through FIG. 9(d).

As shown in FIG. 9(a) through FIG. 9(d), the inner member 122a includes a receiving portion 122R having receiving surfaces 123 and 124, and a support portion 122S formed adjacent to the receiving portion 122R in the y direction and having a support surface 122Sa parallel to the xz plane. The receiving portion 122R of the inner member 122a has a structure different from that of the receiving portion 22R of the inner member 22R shown in FIG. 4(a) through FIG. 4(d). Except for this, the structure of the inner member 122a is the same as that of the inner member 22a. For reference signs representing components of the inner member 122a, "100" will be added to the reference signs representing the corresponding components of the inner member 22a.

First, as shown in FIG. 9(a) through FIG. 9(d), the support portion 122S of the inner member 122a includes a plurality of ribs 125a, 125b and 125c parallel to the xz plane. The support portion 122S also includes a plurality of (five in this example) ribs 128a parallel to the xy plane. The ribs 128a reinforce the support portion 122S and support the receiving surface 124. Therefore, the receiving surface 124 is not easily warped (elastically deformed) even if being supplied with an acceleration (force) in the y direction. Optional protection sheets 127a and 127b are respectively provided on the receiving surfaces 123 and 124. The protection sheets 127a and 127b may be omitted.

Unlike in the inner member 22a (see FIG. 4(d)), in the inner member 122a, the ribs 26a are not provided on a rear surface of the receiving portion 122R (surface opposite to the receiving surface 123, i.e., surface in contact with an outer member 232a (see FIG. 12)). The inner member 122a is structured to be easily warped (elastically deformed) when an acceleration (force) in the −x direction is applied to the receiving surface 123. The inner member 122a is formed of, for example, a non-expanded plastic material, and a portion (flat portion), of the inner member 122a, that includes the receiving surface 123 parallel to the yz plane has a thickness of, for example, 3 mm or less. In the inner member 22a shown in FIG. 4, the receiving portion 22R including the ribs 26a has a thickness (length in the x direction) of, for example, about 10 mm. By contrast, the receiving portion 122R of the inner member 122a has a thickness of, for example, about 3 mm, which is significantly smaller than that of the receiving portion 22R of the inner member 22a.

With reference to FIG. 10 and FIG. 11, the structure of the receiving portion 122R of the inner member 122a will be described in more detail. FIG. 10 is a schematic plan view of the receiving portion 122R of the inner member 122a as seen in the z direction. FIG. 11 is a schematic plan view of the receiving portion 92R of the protection member 92 in the comparative example as seen in the z direction.

The two receiving surfaces RS1 and RS2 of the receiving portion 92R of the protection member 92a in the comparative example shown in FIG. 11 are perpendicular to each other, and cross each other at point Oxy on the xy plane. Where the center of the receiving surface RS1 in the y direction is point RS1c and the center of the receiving surface RS2 in the x direction is point RS2c, the ratio between the distance from point Oxy to point RS1c and the distance from point Oxy to point RS2c is about 1.4:about 1.0, which is smaller than 1.5:1.0.

By contrast, the two receiving surfaces 123 and 124 of the receiving portion 122R of the inner member 122a shown in FIG. 10 are perpendicular to each other, but do not cross each other at point Oxy on the xy plane. A reason for this is that the receiving portion 122R includes a recessed portion (groove extending in the z direction) 122Rd. The recessed portion 122Rd, for example, prevents a tip of a corner of the panel (glass substrate) from touching the receiving surface 123 or 124. Where the center of the receiving surface 123 in the y direction is point 123c and the center of the receiving surface 124 in the x direction is point 124c, the ratio between distance dcy from point Oxy to point 123c and distance dcx from point Oxy to point 124c is about 1.7:about 1.0, which is larger than 1.5:1.0. Namely, in the case where each of the receiving surfaces 123 and 124 is supplied with a force perpendicular thereto, the receiving surface 123 receives a larger moment. In other words, the receiving portion 122R is designed to fulfill dcy>1.5·dcx such that the receiving surface 123 receives a relatively large moment; and is easily warped.

As described above, the thickness of the portion including the receiving surface 123 is small, and dcy<1.5·dcx is fulfilled. With such a structure, the inner member 122a is easily warped (elastically deformed) when an acceleration (force) in the −x direction is applied to the receiving surface 123. The inner member 22a (see, for example, FIG. 4(b)) described above also fulfills the relationship of dcy>1.5·dcx but is not easily warped because the inner member 22a includes the ribs 26a and the thickness of the receiving portion 22R (length in the x direction) is, for example, about 10 mm.

The receiving portion 122R includes an optional wall 126 formed along an end side in the −y direction (extending parallel to the z direction). The wall 126 may be omitted. The wall 126 extends in the −z direction and protrudes in the −x direction. In a state where the inner member 122a and the outer member 232a are fit to each other, the wall 126 is located to hold a portion 237 of the outer member 232a in cooperation with the rib 125a (see FIG. 12). The provision of the wall 126 increases the flatness of the receiving surface 123. Without the wall 126, for example, the portion, of the receiving portion 122R, that includes the receiving surface 123 may be curved to be convex in the −x direction. A bent portion that forms the recessed portion (groove extending in the z direction) 122Rd also contributes to increasing the flatness of the receiving surface 123. In the case where the inner member 122a is formed by injection molding, an internal strain may occur due to the influence of, for example, non-uniformity in the temperature distribution of the die and as a result, the receiving surface 123 may be curved. Formation of the wall 126 and the bent portion (recessed portion 122Rd) adjacent to the receiving surface 123 increases the flatness of the receiving surface 123. This is especially effective in the case where the inner member 122a is formed, by molding, of a crystalline plastic material such as polyethylene, polypropylene or the like.

Figure 13:
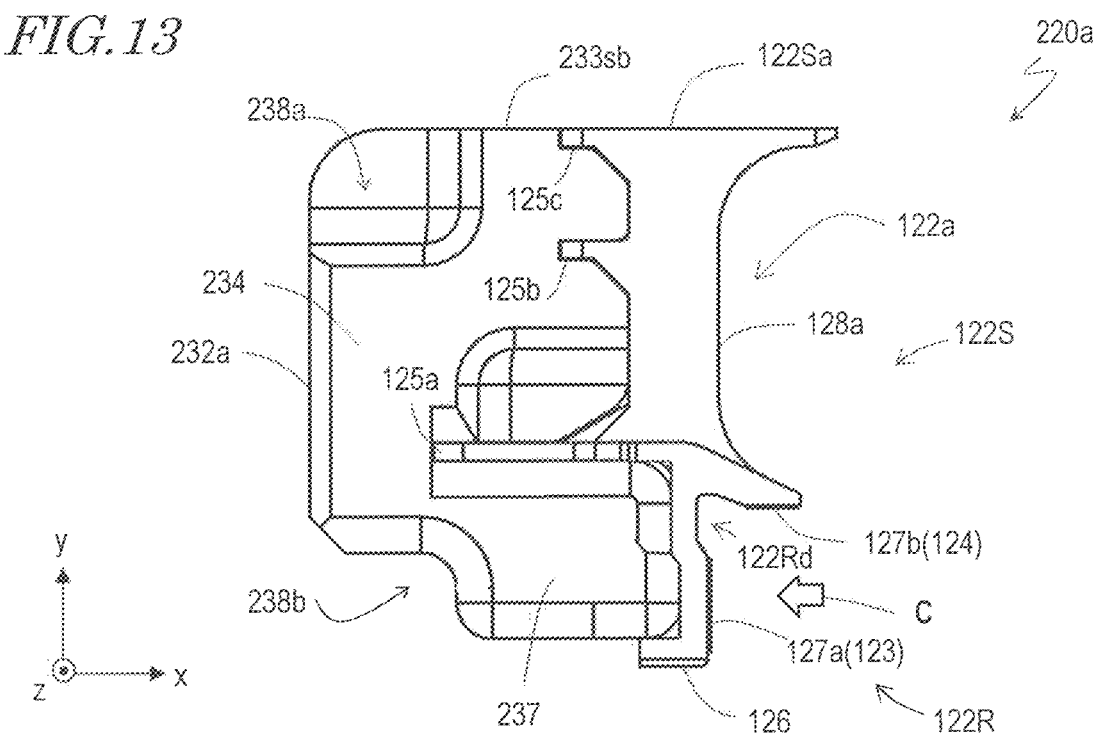

Now, FIG. 12 will be referred to FIG. 12 provides schematic views illustrating the protection member 220a FIG. 12(a) is a schematic perspective view of the outer member 232a, and FIG. 12(b) is a schematic perspective view of the protection member 220a in a state where the inner member 122a is fit to the outer member 232a. FIG. 13 is a schematic plan view of the protection member 220a.

As shown in FIG. 12(a), the outer member 232a has a side surface 233sb parallel to the xz plane and a side surface 234s parallel to the yz plane. The outer member 232a is located such that the side surface 233sb and the side surface 234s are respectively in contact with side surfaces, of the cutout portion 15a of the side surface member 14, that are parallel to xz plane and the yz plane, and such that a bottom surface of the outer member 232a parallel to the xy plane is in contact with the bottom surface member 12. A portion 234 of the outer member 232a is located between the inner member 122a and the side surface member 14b. The outer member 232a further includes recessed portions 238a and 238b. The recessed portions 238a and 238b are provided such that in a state where the outer member 232a is located in the cutout portion 15a, hollows are formed between the outer member 232a and the side surface member 14.

As shown in FIG. 12(a), the outer member 232a includes a plurality of grooves 235a and 235b and a cutout 235c, which are parallel to the xz plane. As shown in FIG. 12(b) and FIG. 13, the ribs 125a, 125b and 125c of the inner member 122a are respectively inserted into the plurality of the grooves 235a and 235b and the cutout 235c of the outer member 232a, and as a result, the inner member 122a and the outer member 232a are fit to each other. In a state where the inner member 122a and the outer member 232a are fit to each other, the portion 237 of the outer member 232a is held between the wall 126 of the inner member 122a and the rib 125a. In this state, the portion 237 of the outer member 232a is in contact with a rear surface of the receiving portion 122R (surface opposite to the receiving surface 123) of the inner member 122a.

Unlike in the outer member 132a, in the outer member 232a, the portion 237 is smaller than the portion 137 of the outer member 132a shown in FIG. 7(a). Except for this, the structure of the outer member 232a is the same as that of the outer member 132a. For reference signs representing components of the outer member 232a, "100" will be added to the reference signs representing the corresponding components of the outer member 132a.

In a state where the inner member 122a and the outer member 232a are fit to each other, the support surface 122Sa of the inner member 122a is substantially flush with the side surface 233sb, of the outer member 232a, parallel to the xz plane. The expression that "the support surface 122Sa of the inner member 122a and the side surface 233sb of the outer member 232a are substantially flush with each other" indicates that the support surface 122Sa and the side surface 233sb are flush with each other to such a degree that the support surface 122Sa and the side surface 233sb may both be in contact with the side surface, of the side surface member 14, that is parallel to the xz plane. The protection member 220a, when being attached to the cutout portion 15a, is located such that the support surface 122Sa of the inner member 122a and the side surface 233sb of the outer member 232a are in contact with the side surface, of the side surface member 14, that is parallel to the xz plane. The support surface 122Sa of the inner member 122a protrudes in the x direction more than the receiving surface 124 parallel to the xz plane. Therefore, like in the case of the protection members 20a and 120a described above, even if an acceleration is applied to the panel module 200 in the y direction, and as a result, a force acts on the protection member 220a so as to rotate the protection member 220a counterclockwise, the support surface 122Sa of the inner member 122a and the side surface 233sb of the outer member 232a receive a reaction from the side surface member 14, and as a result, the protection member 220a does not rotate.

As described above with reference to FIG. 9, the receiving portion 122R of the protection member 220a is structured to be easily warped (elastically deformed) when an acceleration (force) in the −x direction is applied to the receiving surface 123. Therefore, even if an acceleration is applied to the panel module 200 in the −x direction as represented by arrow c shown in FIG. 13, and as a result, a force acts on the protection member 220a so as to rotate the protection member 220a clockwise, the protection member 220a does not rotate because the receiving surface 123 of the inner member 122a is easily warped (elastically deformed). For this reason, even if the accommodated object is formed of a material that is easily cracked or chipped away like a display panel, the corner of the accommodated object is suppressed from being cracked or chipped away.

Namely, the protection member 220a provides all the effects of the protection member 120a, and also has an advantage of suppressing a corner of the accommodated object from being cracked or chipped away when an acceleration is applied to the accommodated object in the −x direction. The outer member 232a may include a portion 33 of the outer member 32a shown in FIG. 5(a).

Now, preferred materials for each of the components of the container 100 will be described. The materials described below are preferred examples of materials for the container 100 transporting the panel module 200, and the preferred materials are not limited to those described below.

The accommodation member 10 (bottom surface member 12 and side surface member 14), the outer members 32a, 132a and 232a and the inner members 22a and 122a may all be formed of a plastic material. A plastic material preferably usable for these components is any of various known plastic materials (thermoplastic resins). Examples of the usable plastic material include polyolefins such as polyethylene, polypropylene and the like, polystyrenes, and mixtures (blends) thereof. These plastic materials in an expanded form are also usable.

For the accommodation member 10, a material having a large effect of absorbing the impact during the transportation is preferred. The accommodation member 10 is preferably formed of an expanded plastic material. For the inner member 22a, which directly receives a force from, the panel module 200 (panel 202), a material harder than the material of the outer members 32a, 132a and 232a and the material of the accommodation member 10 is preferred. The inner member 22a is preferably formed of a nan-expanded plastic material. The protection sheets 27a, 27b, 127a and 127b are preferably formed of a non-expanded plastic material harder than the material of the inner members 22a and 122a. The outer members 32a, 132a and 232a, which are each located between the accommodation member 10 and the inner member 22a or 122a, are preferably formed of a material having a hardness between the hardness of the material of the accommodation member 10 and the hardness of the material of the inner members 22a and 122a, or a material having a hardness approximately equal to that of the material of the accommodation member 10, for example, an expanded plastic material.

For example, the inner members 22a and 122a are formed of, preferably, non-expanded polyethylene, and more preferably, high density polyethylene from the point, of view of the hardness. The protection sheets 27a, 27b, 127a and 127b are in direct contact with, for example, a glass substrate of the panel module 200 (panel 202) and therefore, is preferably formed of polycarbonate, which is highly abrasion resistant.

The outer members 32*a*, 132*a* and 232*a* are preferably formed of, for example, expanded polyethylene (EPS) or expanded polypropylene (EPP). Alternatively, an expanded form of a mixture (blend) of polyethylene or polypropylene and polystyrene may be used for the outer members 32*a*, 132*a* and 232*a*. The expansion ratio of these expanded plastic materials is, for example, 10 to 20 times. For example, an expanded form of a mixture (blend) of polyethylene and polystyrene expanded at a ratio of 10 times is preferably usable for the outer members 32*a*, 132*a* and 232*a*.

The accommodation member 10 is preferably formed of expanded polyethylene (EPE), expanded polypropylene (EPP) or expanded polystyrene (EPS, also referred to as "styrofoam"). Among these materials, expanded polystyrene (EPS) is most preferable. It should be noted that in order to transport the panel module 200 more safely, it is especially preferred to use expanded polystyrene expanded at a ratio lower than that of commonly and widely used expanded polystyrene (expansion ratio: about 70 times), for example, expanded polystyrene expanded at a ratio of about 20 times to about 50 times.

The above-described materials have been selected based on results of an impact test. For the impact test, a state where 20 liquid crystal display panel modules (60-inch type) were accommodated in the container 100 produced with various materials was simulated. With the above-described materials, the liquid crystal display panel modules may be transported very safely. Namely, the liquid crystal display panel modules may be suppressed from being broken during the transportation. The 60-inch liquid crystal display panel modules used for the test had a size of about 1300 mm×about 800 mm. The container 100 had an outer shape of about 1500 mm to about 1600 mm×about 900 mm to about 1000 mm and a height of about 120 mm to about 150 mm. In order to increase the strength, the outer shape of the container 100 may be increased. In order to increase the transportation efficiency and decrease the cost, the outer shape of the container 100 may be decreased. The material of each of the components may be selected from the above-listed materials/and the size of each of the components may be optimized, in accordance with the use.

INDUSTRIAL APPLICABILITY

An embodiment of the present invention is directed to a container preferably usable to, for example, transport an object accommodated therein.

REFERENCE SIGNS LIST

10 accommodation member
10*s* accommodation space
12 bottom surface member
14, 14*a*, 14*b*, 14*c*, 14*d* side surface member
14*s* stepped portion
15*a*, 15*b*, 15*c*, 15*d* cutout portion
20*a*, 20*b*, 20*c*, 20*d*, 120*a*, 220*a* protection member
22R receiving portion
22Rb bottom surface
22S support portion
22Sa support surface
22Sb bottom surface
22*a*, 122*a* inner member
23, 24, 123, 124 receiving surface
25*a*, 25*b*, 25*c*, 125*a*, 125*b*, 125*c* rib
26*a*, 28*a*, 128*a* rib
235*c* cutout
32*a*, 132*a*, 232*a* outer member
35*a*, 35*b*, 35*c*, 135*a*, 135*b*, 135*c*, 235*a*, 235*b* groove
70 lid
100 container
200 liquid crystal display panel module
202 liquid crystal display panel
204 circuit board

The invention claimed is:

1. A container, comprising:
   an accommodation member including a bottom surface member defining a bottom surface of an accommodation space having four corners and also including a side surface member defining side surfaces of the accommodation space, the bottom surface member defining an xy plane and the side surface member defining an xz plane and a yz plane both perpendicular to the xy plane; and
   two protection members each having a first receiving surface and a second receiving surface that are to be in contact with an object to be accommodated in the accommodation space and are respectively parallel to the yz plane and the xz plane,
   wherein the side surface member includes two cutout portions respectively facing two corners adjacent to each other among the four corners of the accommodation space,
   wherein each of the two protection members includes an inner member including a receiving portion having the first receiving surface and the second receiving surface and also includes an outer member located at least between the inner member and a side surface, of the side surface member, that is parallel to the yz plane, the outer member being fit to the inner member so as to be slidable in a certain direction crossing the bottom surface,
   wherein the two protection members are respectively located in the two cutout portions in a state where the inner member and the outer member included in each of the two protection members are detachable in the certain direction independently, and
   wherein a portion, of the inner member, that includes the first receiving surface is more easily warped than a portion, of the inner member, that includes the second receiving surface.

2. The container of claim 1, wherein where an intersection, on the xy plane, of a plane including the first receiving surface and a plane including the second receiving surface is the origin, a distance from the origin to the center of the first receiving surface in a y direction is dcy, and a distance from the origin to the center of the second receiving surface in an x direction is dcx, the container fulfills dcy>1.5·dcx.

3. The container of claim 1, wherein the inner member is formed of a non-expanded plastic material, and the portion of the inner member including the first receiving surface has a thickness of 3 mm or less.

4. The container of claim 1, wherein the inner member further includes a wall provided along an end side of the receiving portion in a −y direction, the wall protruding in a −x direction.

5. The container of claim 1, wherein the outer member is formed of an expanded plastic material.

6. The container of claim 1, wherein the inner member further includes a support portion formed adjacent to the receiving portion in a y direction and having a support surface parallel to the xz plane, and the support surface protrudes in an x direction more than the second receiving surface.

7. The container of claim 6, wherein the support surface of the inner member is contactable with a side surface, of the side surface member, that is parallel to the xz plane.

8. The container of claim 6, wherein the support surface of the inner member and a side surface, of the outer member, that is parallel to the xz plane are substantially flush with each other.

9. The container of claim 6, wherein the outer member is also located between the support surface and a side surface, of the side surface member, that is parallel to the xz plane.

10. The container of claim 6,
wherein the receiving portion of the inner member has a bottom surface in contact with the bottom surface member and parallel to the xy plane, and
wherein a bottom surface, of the support portion, facing the bottom surface member and parallel to the xy plane is not in contact with the bottom surface member.

11. The container of claim 6, wherein a length of the receiving portion in a z direction is longer than a length of the support portion in the z direction.

12. The container of claim 10, wherein the center of gravity of the inner member is present outer to the bottom surface of the receiving portion as seen in a z direction.

13. The container of claim 1, further comprising a protection sheet provided on each of the first receiving surface and the second receiving surface of the inner member, and the protection sheet is formed of a non-expanded plastic material harder than the material of the inner member.

14. The container of claim 5, wherein the accommodation member is formed of an expanded plastic material having a hardness equal to that of the expanded plastic material of the outer member or an expanded plastic material softer than the expanded plastic material of the outer member.

15. The container of claim 1, wherein when the outer member is detached, the inner member falls toward a space where the outer member was present before being detached.

16. The container of claim 1, wherein the outer member is fit to the inner member so as to be slidable in a z direction.

17. The container of claim 16, wherein the inner member includes a plurality of ribs parallel to the xz plane, and the outer member includes a plurality of grooves parallel to the xz plane.

18. The container of claim 1, wherein the inner member and the outer member each have a plane of symmetry parallel to the xy plane.

* * * * *